United States Patent
Lin

(10) Patent No.: US 11,414,759 B2
(45) Date of Patent: Aug. 16, 2022

(54) MECHANISMS FOR SUPPLYING PROCESS GAS INTO WAFER PROCESS APPARATUS

(71) Applicant: Taiwan Semiconductor Manufacturing Co., Ltd, Hsin-Chu (TW)

(72) Inventor: Su-Horng Lin, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 613 days.

(21) Appl. No.: 14/093,084

(22) Filed: Nov. 29, 2013

(65) Prior Publication Data

US 2015/0152991 A1    Jun. 4, 2015

(51) Int. Cl.
*C23C 16/458*    (2006.01)
*C23C 16/455*    (2006.01)
(Continued)

(52) U.S. Cl.
CPC ...... *C23C 16/4584* (2013.01); *C23C 16/4412* (2013.01); *C23C 16/45504* (2013.01);
(Continued)

(58) Field of Classification Search
CPC .......... C23C 16/4412; C23C 16/45504; C23C 16/45517; C23C 16/45561; C23C 16/45563; C23C 16/4558; C23C 16/45585; C23C 16/45591; C23C 16/4584; C30B 25/14; C30B 25/16–165; H01J 37/3244–32449; H01L 21/02387–0238;
(Continued)

(56) References Cited

U.S. PATENT DOCUMENTS 1,685,701 A * 9/1928 Blanchard ................ F01N 1/08
                                                                    181/268
2,393,893 A * 1/1946 Evans ........................ B01J 8/12
                                                                    208/171
(Continued)

FOREIGN PATENT DOCUMENTS

JP    2000269147 A * 9/2000
JP    2002231641 A * 8/2002
(Continued)

OTHER PUBLICATIONS

M. Josefsson. Forum Geometricorum. 13 (2013). pp. 23-35. (Year: 2013).*

(Continued)

*Primary Examiner* — Jeffrie R Lund
*Assistant Examiner* — Stanislav Antolin
(74) *Attorney, Agent, or Firm* — McClure, Qualey & Rodack, LLP

(57) ABSTRACT

Embodiments of mechanisms for processing a semiconductor wafer are provided. A method for processing a wafer includes providing a wafer process apparatus. The wafer process apparatus includes a chamber and a stage positioned in the chamber for supporting the semiconductor wafer. The method also includes supplying a process gas to the semiconductor wafer via a discharging assembly that is adjacent to the stage. The discharging assembly includes a discharging passage configured without a vertical flow path section.

20 Claims, 5 Drawing Sheets

(51) Int. Cl.
  *C23C 16/44* (2006.01)
  *C30B 25/14* (2006.01)
  *C30B 25/02* (2006.01)
  *C30B 25/16* (2006.01)
  *H01J 37/32* (2006.01)
  *H01L 21/205* (2006.01)

(52) U.S. Cl.
  CPC .............. *C30B 25/14* (2013.01); *C30B 25/02* (2013.01); *C30B 25/16* (2013.01); *C30B 25/165* (2013.01); *H01J 37/3244* (2013.01); *H01J 37/32449* (2013.01); *H01L 21/205* (2013.01); *Y10T 137/0318* (2015.04); *Y10T 137/6416* (2015.04)

(58) Field of Classification Search
  CPC ..... H01L 21/0262; H01L 21/205–2056; Y10T 137/0318; Y10T 137/0357; Y10T 137/6416
  See application file for complete search history.

(56) References Cited

U.S. PATENT DOCUMENTS

| | | | | |
|---|---|---|---|---|
| 2,559,589 | A * | 7/1951 | Brierly | F23D 11/10 110/260 |
| 5,108,792 | A * | 4/1992 | Anderson | C23C 16/44 118/715 |
| 5,179,677 | A * | 1/1993 | Anderson | H01L 21/67115 392/411 |
| 5,269,847 | A * | 12/1993 | Anderson | C23C 16/455 118/715 |
| 5,453,124 | A * | 9/1995 | Moslehi | C23C 16/45561 118/715 |
| 5,482,739 | A * | 1/1996 | Hey | C23C 16/345 427/248.1 |
| 5,496,408 | A * | 3/1996 | Motoda | C23C 16/4481 118/715 |
| 5,532,190 | A * | 7/1996 | Goodyear | C23C 16/45512 118/715 |
| 5,551,982 | A * | 9/1996 | Anderson | C23C 16/455 118/715 |
| 5,551,985 | A | 9/1996 | Brors et al. | |
| 5,599,397 | A * | 2/1997 | Anderson | C23C 16/455 118/500 |
| 5,679,167 | A * | 10/1997 | Muehlberger | B41N 3/032 118/620 |
| 5,916,369 | A * | 6/1999 | Anderson | C23C 16/455 118/715 |
| 6,025,013 | A * | 2/2000 | Heming | C23C 16/455 427/162 |
| 6,042,652 | A * | 3/2000 | Hyun | C23C 16/44 118/719 |
| 6,113,703 | A * | 9/2000 | Anderson | C23C 16/455 118/724 |
| 6,132,512 | A * | 10/2000 | Horie | C23C 16/45565 118/715 |
| 6,153,260 | A * | 11/2000 | Comita | C23C 16/4408 118/719 |
| 6,159,866 | A * | 12/2000 | Gronet | C01B 13/322 257/E21.282 |
| 6,179,913 | B1 * | 1/2001 | Solomon | C23C 16/303 117/99 |
| 6,262,393 | B1 * | 7/2001 | Imai | C23C 16/458 118/50.1 |
| 6,302,965 | B1 * | 10/2001 | Umotoy | C23C 16/16 118/715 |
| 6,352,084 | B1 * | 3/2002 | Oshinowo | H01L 21/67051 134/182 |
| 6,399,510 | B1 * | 6/2002 | Riley | C23C 16/455 156/345.1 |
| 6,499,425 | B1 * | 12/2002 | Sandhu | C23C 16/34 118/723 E |
| 6,500,734 | B2 * | 12/2002 | Anderson | C23C 16/45504 438/478 |
| 6,572,707 | B1 * | 6/2003 | Nguyen | C23C 16/4485 118/726 |
| 8,992,684 | B1 * | 3/2015 | Kovalenkov | C30B 25/14 118/715 |
| 2001/0032588 | A1 * | 10/2001 | Harafuji | C23C 16/301 118/715 |
| 2002/0017244 | A1 * | 2/2002 | Sillmon | C30B 25/14 118/715 |
| 2002/0025657 | A1 * | 2/2002 | Anderson | C23C 16/45504 438/478 |
| 2002/0052097 | A1 * | 5/2002 | Park | C23C 16/45544 438/507 |
| 2002/0173164 | A1 * | 11/2002 | Raffin | C23C 16/45574 438/761 |
| 2002/0195054 | A1 * | 12/2002 | Harafuji | C23C 16/45582 118/715 |
| 2003/0001160 | A1 * | 1/2003 | Ose | C23C 16/455 257/66 |
| 2003/0019428 | A1 * | 1/2003 | Ku | C23C 16/455 118/715 |
| 2003/0044616 | A1 * | 3/2003 | Ose | C23C 16/45561 428/409 |
| 2003/0092266 | A1 * | 5/2003 | Anderson | C23C 16/45504 438/689 |
| 2003/0150560 | A1 * | 8/2003 | Kinnard | C23C 16/455 156/345.33 |
| 2003/0172872 | A1 * | 9/2003 | Thakur | C23C 16/45536 118/715 |
| 2003/0190423 | A1 * | 10/2003 | Yang | C23C 16/45544 427/255.28 |
| 2003/0190497 | A1 * | 10/2003 | Yang | C23C 16/45565 428/698 |
| 2003/0221780 | A1 * | 12/2003 | Lei | C23C 16/45574 156/345.29 |
| 2004/0050325 | A1 * | 3/2004 | Samoilov | C23C 16/45561 118/715 |
| 2004/0050326 | A1 * | 3/2004 | Thilderkvist | C23C 16/45574 118/715 |
| 2004/0129212 | A1 * | 7/2004 | Gadgil | C23C 16/452 118/715 |
| 2004/0237883 | A1 * | 12/2004 | Maydan | G02B 6/132 117/200 |
| 2005/0268856 | A1 * | 12/2005 | Miller | C23C 16/45544 118/729 |
| 2006/0216415 | A1 * | 9/2006 | Olson | C23C 16/045 427/237 |
| 2006/0249695 | A1 * | 11/2006 | Choi | F27B 5/04 250/492.2 |
| 2006/0275546 | A1 * | 12/2006 | Arena | C23C 16/303 427/248.1 |
| 2007/0087533 | A1 * | 4/2007 | Nishikawa | C23C 16/45591 438/478 |
| 2007/0107653 | A1 * | 5/2007 | Yamada | C23C 16/455 117/84 |
| 2007/0122323 | A1 * | 5/2007 | Yamada | C23C 16/45587 422/243 |
| 2007/0170148 | A1 * | 7/2007 | Kuppurao | C23C 16/452 216/58 |
| 2007/0259112 | A1 * | 11/2007 | Ishikawa | C23C 16/45561 427/248.1 |
| 2007/0267143 | A1 * | 11/2007 | Carlson | C23C 16/4412 156/345.48 |
| 2007/0281084 | A1 * | 12/2007 | Hirosawa | C23C 16/45565 427/248.1 |
| 2008/0069951 | A1 * | 3/2008 | Chacin | C23C 16/45521 427/248.1 |
| 2008/0092812 | A1 * | 4/2008 | McDiarmid | H01L 21/67017 118/695 |
| 2008/0178810 | A1 * | 7/2008 | Koizumi | C23C 16/45589 118/730 |
| 2008/0210163 | A1 * | 9/2008 | Carlson | C23C 16/22 118/715 |
| 2008/0219824 | A1 * | 9/2008 | Newman | H01L 21/68771 414/744.5 |

(56) References Cited

U.S. PATENT DOCUMENTS

| | | | |
|---|---|---|---|
| 2008/0220150 A1* | 9/2008 | Merry | C30B 25/14 427/8 |
| 2008/0274604 A1* | 11/2008 | Sanchez | C23C 16/4581 438/507 |
| 2008/0289575 A1* | 11/2008 | Burrows | C23C 16/4488 118/715 |
| 2009/0056629 A1* | 3/2009 | Katz | H01L 21/3065 118/723 R |
| 2009/0057269 A1* | 3/2009 | Katz | H01J 37/32449 216/67 |
| 2009/0156013 A1* | 6/2009 | Yousif | H01J 37/32357 438/725 |
| 2009/0163042 A1* | 6/2009 | Tseng | H01L 21/67017 438/795 |
| 2009/0314205 A1* | 12/2009 | Patalay | G02B 23/2492 118/713 |
| 2010/0018463 A1* | 1/2010 | Yu | C23C 16/301 118/715 |
| 2010/0029066 A1* | 2/2010 | Miyashita | C23C 16/4584 438/478 |
| 2010/0055476 A1* | 3/2010 | Haack | B05D 1/62 428/447 |
| 2010/0071622 A1* | 3/2010 | Carlson | C23C 2/26 118/726 |
| 2010/0120259 A1* | 5/2010 | Vatus | C23C 16/45504 438/758 |
| 2010/0166955 A1* | 7/2010 | Becker | C23C 16/4401 427/248.1 |
| 2010/0167551 A1* | 7/2010 | DeDontney | C23C 16/45578 438/758 |
| 2010/0263587 A1* | 10/2010 | Sivaramakrishnan | C30B 25/08 117/94 |
| 2010/0267245 A1* | 10/2010 | Kamian | C23C 16/45502 438/758 |
| 2010/0279008 A1* | 11/2010 | Takagi | C23C 16/409 427/248.1 |
| 2011/0067632 A1* | 3/2011 | Poppe | C23C 16/45521 118/728 |
| 2011/0086434 A1* | 4/2011 | Shin | B01L 3/502738 436/501 |
| 2011/0098841 A1* | 4/2011 | Tsuda | C23C 16/409 700/117 |
| 2011/0121503 A1* | 5/2011 | Burrows | C23C 16/4412 269/289 R |
| 2011/0174212 A1* | 7/2011 | Ramachandran | C23C 16/455 117/98 |
| 2011/0247556 A1* | 10/2011 | Raring | C23C 16/45519 118/713 |
| 2011/0277681 A1* | 11/2011 | Arena | C23C 16/34 117/88 |
| 2011/0308458 A1* | 12/2011 | Sung | H01L 21/67742 118/719 |
| 2011/0318905 A1* | 12/2011 | Chiruvolu | C09D 11/322 438/478 |
| 2012/0083100 A1* | 4/2012 | Bertram, Jr. | C23C 16/303 438/478 |
| 2012/0085278 A1* | 4/2012 | Moslehi | C23C 16/45585 117/104 |
| 2012/0148744 A1* | 6/2012 | Colvin | C23C 16/45502 427/255.11 |
| 2012/0170403 A1* | 7/2012 | Li | B28B 19/0092 366/177.1 |
| 2012/0305190 A1* | 12/2012 | Kang | C23C 16/45563 156/345.34 |
| 2013/0014698 A1* | 1/2013 | Kools | C23C 16/45525 118/715 |
| 2013/0019978 A1* | 1/2013 | Kools | C23C 16/45525 137/833 |
| 2013/0032084 A1* | 2/2013 | Sivaramakrishnan | C30B 29/06 117/102 |
| 2013/0125819 A1* | 5/2013 | Borean | C23C 16/4584 118/725 |
| 2013/0160946 A1* | 6/2013 | Smargiassi | H01L 21/02348 156/345.5 |
| 2014/0097270 A1* | 4/2014 | Liang | H01J 37/3244 239/132.3 |
| 2014/0137801 A1* | 5/2014 | Lau | C30B 25/14 118/728 |
| 2014/0199056 A1* | 7/2014 | Chang | H01L 21/67115 392/416 |
| 2014/0209023 A1* | 7/2014 | Tsuda | C23C 16/409 118/715 |
| 2014/0216585 A1* | 8/2014 | Tjandra | H01L 21/67017 137/896 |
| 2014/0224174 A1* | 8/2014 | Abedijaberi | C23C 16/45563 118/715 |
| 2014/0224175 A1* | 8/2014 | Abedijaberi | C23C 16/4401 118/719 |
| 2014/0261159 A1* | 9/2014 | Okabe | C30B 25/12 117/98 |
| 2014/0273409 A1* | 9/2014 | Pitney | C23C 16/45585 438/478 |
| 2014/0273410 A1* | 9/2014 | Abedijaberi | C23C 16/45561 438/478 |
| 2014/0322897 A1* | 10/2014 | Samir | H01L 21/67017 438/478 |
| 2015/0075430 A1* | 3/2015 | Shah | C30B 25/08 118/724 |
| 2015/0152991 A1* | 6/2015 | Lin | C23C 16/4412 137/1 |

FOREIGN PATENT DOCUMENTS

| | | | | |
|---|---|---|---|---|
| JP | | 2007012664 A | * 1/2007 | H01L 21/205 |
| WO | WO | 2013121102 A2 | * 8/2013 | C23C 16/45544 |
| WO | WO | 2013182878 A2 | * 12/2013 | C30B 25/14 |
| WO | WO | 2013182879 A2 | * 12/2013 | C30B 25/14 |
| WO | WO | 2014113179 A1 | * 7/2014 | H01L 21/67115 |

OTHER PUBLICATIONS

Tom Ruen. "Trapezoids: Special Cases." 2015. CC BY-SA 4.0. Available on line Jan. 27, 2019 at: https://commons.wikimedia.org/w/index.php?curid=39504620. (Year: 2015).*

"The equation of a line:" in Eberhard Zeidler et al. Editors. Oxford Users' Guide to Mathematics. pp. 17-18. 2004. (Year: 2004).*

Chinese language office action dated Jul. 22, 2016, issued in application No. TW 103115916.

* cited by examiner

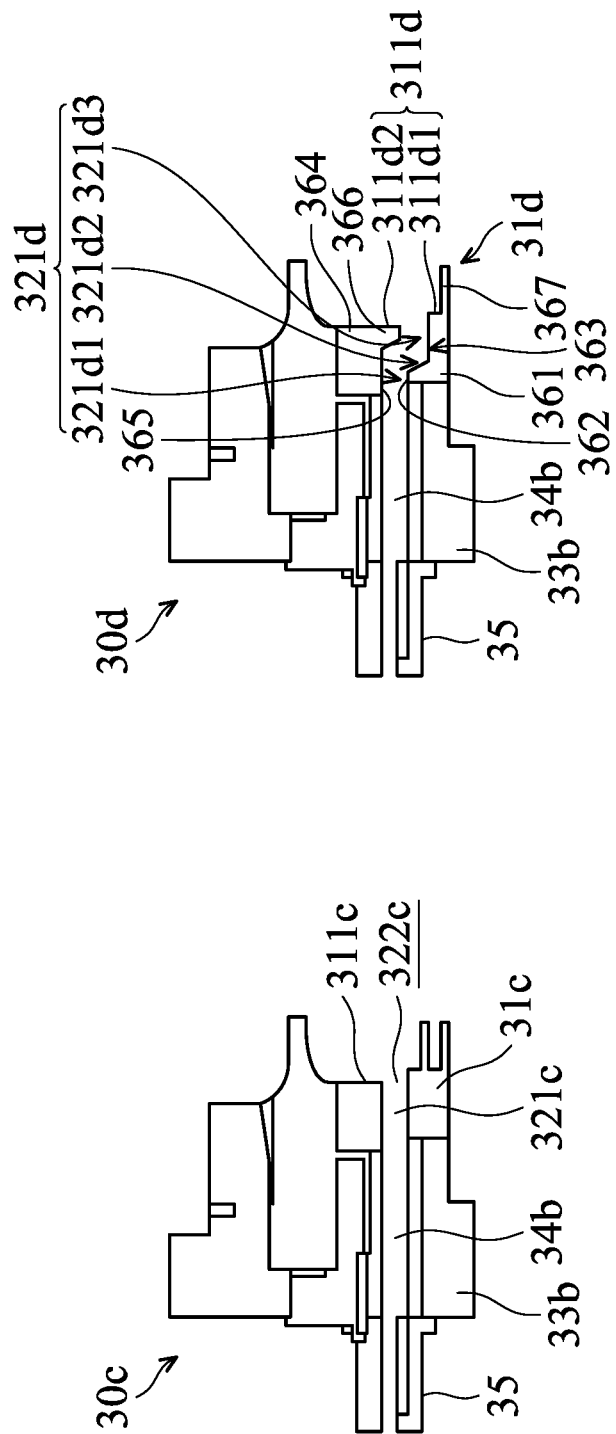

MECHANISMS FOR SUPPLYING PROCESS GAS INTO WAFER PROCESS APPARATUS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of integrated circuits, an epitaxial (epi) layer may be deposited on a semiconductor wafer by chemical vapor deposition (CVD) process, and the epi layer is deposited using a mixture of a silicon source gas. Since deposition may happen on any exposed heated surface of the semiconductor wafer after the silicon source gas is heated, it is advantageous to reduce the chamber area allocated to gas as much as possible.

However, the profile uniformity of the epi layer is affected by the gas flow distribution of the silicon source gas. For a semiconductor wafer with large size, maintaining a uniform process gas flow during the CVD process over the large wafer surface has become increasingly difficult. Therefore, there is a need for an improved mechanism for delivering the process gas in a uniform manner.

BRIEF DESCRIPTION OF THE DRAWINGS

For a more complete understanding of the embodiments and the advantages thereof, reference is now made to the following descriptions taken in conjunction with the accompanying drawings.

FIG. 5 shows a cross-sectional view of a discharging assembly, in accordance with some embodiments.

FIG. 6 shows a cross-sectional view of a discharging assembly, in accordance with some embodiments.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
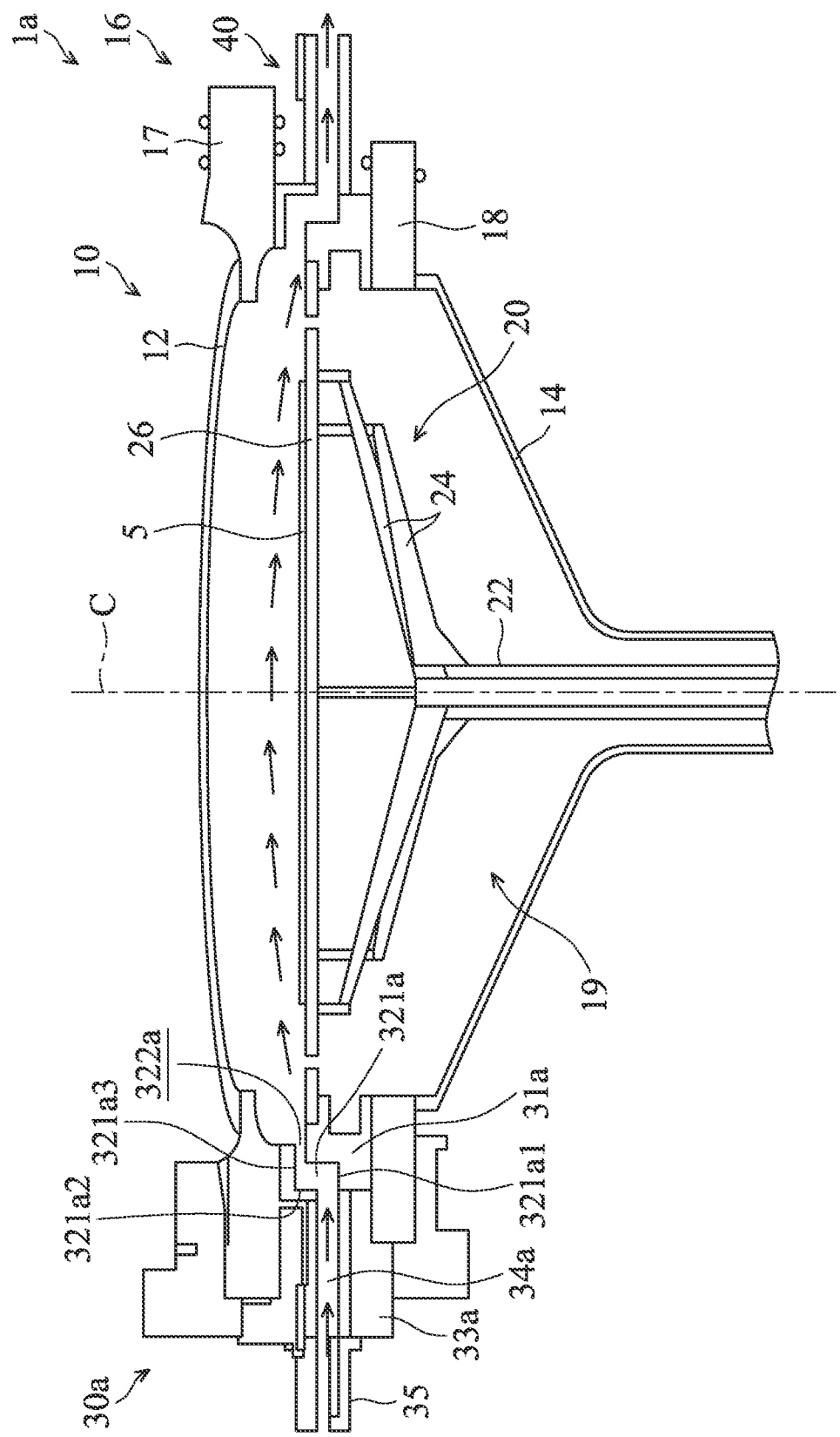
FIG. 1 shows a cross-sectional view of a wafer process apparatus, in accordance with some embodiments.

Referring to FIG. 1, a cross-sectional view of a wafer process apparatus 1a for depositing an epitaxial (epi) layer on a semiconductor wafer 5 is shown, in accordance with some embodiments. In some embodiments, the wafer process apparatus 1a includes a housing 10, a susceptor module 20, a fluid inlet module 30a, and an fluid outlet module 40.

The housing 10 includes an upper portion 12, a lower portion 14, and a side portion 16. The upper portion 12, the lower portion 14, and the side portion 16 define a chamber 19 in the housing 10. In some embodiments, the chamber 19 is capable of receiving one or more semiconductor wafer 5, which is 450 mm or more in diameter.

In some embodiments, the upper portion 12, the lower portion 14 are made of material that exhibits a relatively high structural strength and is chemically stable in the process environment. In some embodiments, the upper portion 12 and the lower portion 14 are transparent so as to allow light, either visible light or IR light, from a lamp (not shown in the figures) to enter the chamber 19. In some embodiments, the upper portion 12 and the lower portion 14 are made from clear quartz.

In some embodiments, the side portion 16 includes an upper clamping element 17 and a lower clamping element 18. The upper clamping element 17 and the lower clamping element 18 are combined together through suitable means, such as screwing, to fix the fluid inlet module 30a and the fluid outlet module 40.

The susceptor module 20 includes a shaft 22, a number of supports 24, and a stage 26. The lower end of each support 24 is connected to the shaft 22, and the upper end is connected to the bottom surface of the stage 26. As a result, the stage 26 is horizontally fixed on the upper ends of the supports 24 for supporting the semiconductor wafer 5. In some embodiments, the susceptor module 20 is coupled to a variable speed motor (not shown) by a shaft 22 so as to rotate about a rotation axis C. The susceptor module 20 may be stationary or may be rotated at various speeds from about 0 rpm to about 2000 rpm.

The fluid inlet module 30a and the fluid outlet module 40 are positioned at two sides of the susceptor module 20 so as to produce a gas flow passing along the upper surface of the stage 26. In some embodiments, the fluid inlet module 30a and the fluid outlet module 40 are positioned at two opposite sides of the susceptor module 20. Process gas, such as silicon source gas, provided from the fluid inlet module 30a is made to flow through the upper surface of the stage 26 and is exhausted by the fluid outlet module 40 as indicated by arrows shown in FIG. 1.

Figure 2:
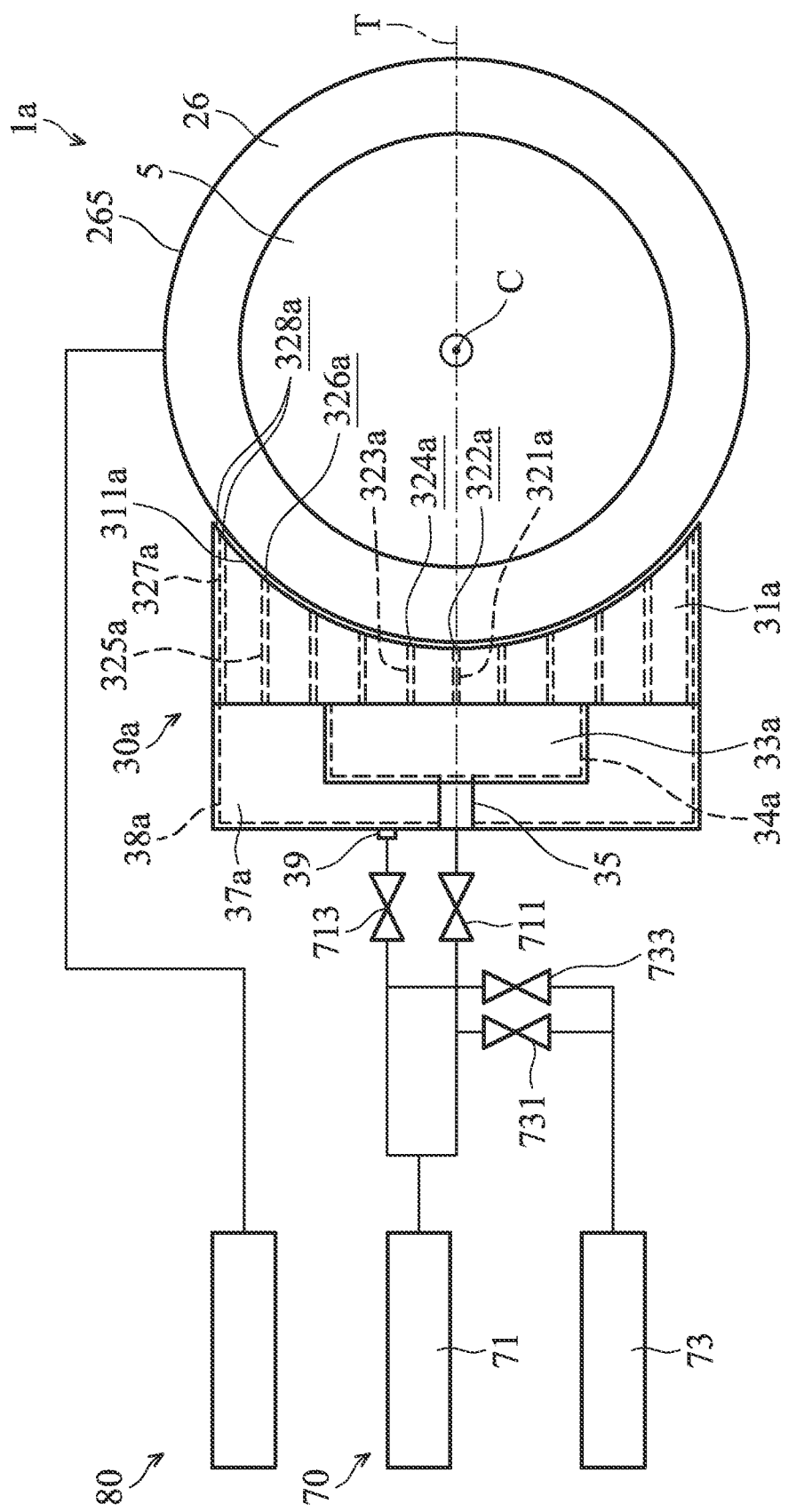
FIG. 2 shows a top view of a wafer process apparatus, in accordance with some embodiments.

Referring to FIG. 2, a top view of the wafer process apparatus 1a is shown, in accordance with some embodiments. In some embodiments, the fluid inlet module 30a includes one or more interface assemblies, such as interface assemblies 33a and 37a, and one or more inlet connector assemblies, such as inlet connector assemblies 35 and 39. The interface assembly 33a has an interface passage 34a fluidly connected to the inlet connector assembly 35. The interface assembly 37a has a fluid passage 38a fluidly connected to the inlet connector assembly 39.

In some embodiments, the fluid inlet module 30a is fluidly connected to a first gas-supply module 70. Process gas from the first gas-supply module 70 is provided to the semiconductor wafer 5 via the fluid inlet module 30a. In some embodiments, the first gas-supply module 70 includes a main gas source 71, an auxiliary gas source 73, and a number of flow control means, such as flow control means 711, 713, 731, and 733, in accordance with some embodiments.

The inlet connector assembly 35 is fluidly connected to the main gas source 71 and the auxiliary gas source 73 via the flow control means 711. The inlet connector assembly 39 is fluidly connected to the main gas source 71 and the auxiliary gas source 73 via the flow control means 713. The flow control means 711 and 713 control the flow rate of the process gas supplied into the fluid inlet module 30a. In some embodiments, the flow control means 731 and 733 are normally switched off. The process gas from the auxiliary gas source 73 is not supplied to the inlet connector assemblies 35 and 39 until the flow control means 731 and 733 are switched on.

In some embodiments, the fluid inlet module 30a further includes a discharging assembly 31a. The discharging assembly 31a is connected to the interface assemblies 33a and 37a. The discharging assembly 31a has a lateral surface 311a arranged adjacent to the edge 265 of the stage 26. The discharging assembly 31a may include one or more discharging passages configured for allowing fluid from the interface assemblies 33a and 37a to be discharged to the semiconductor wafer 5. For example, the discharging assembly 31a includes multiple discharging passages, such as discharging passages 321a, 323a, 325a, and 327a.

In some embodiments, the discharging passages 321a, 323a, 325a, and 327a fluidly connect the fluid passages 34a and 38a to the openings formed on the lateral surface 311a of the discharging assembly 31a. For example, one end of each of the discharging passages 321a and 323a is fluidly connected to the interface passage 34a of the interface assembly 33a. The other end of each of the discharging passages 321a and 323a is fluidly connected to one of the openings 322a and 324a formed on the lateral surface 311a. In addition, one end of each of the fluid passages 325a and 327a is fluidly connected to the fluid passage 38a of the interface assembly 37a. The other end of each of the fluid passages 325a and 327a is fluidly connected to one of the openings 326a and 328a formed on the lateral surface 311a.

As shown in FIG. 1, in some embodiments, the discharging passage 321a has a vertical fluid path section. Namely, a right angle is formed at a portion of the discharging passage 321a. For example, the discharging passage 321a includes an outer flow path section 321a1, a vertical flow path section 321a2, and an inner flow path section 321a3. The outer flow path section 321a1 is fluidly connected to the fluid passage 34a. The vertical flow path section 321a2 fluidly connects the outer flow path section 321a1 to the inner flow path section 321a3. The outer flow path section 321a1 and the inner flow path section 321a3 extend in a direction perpendicular to the rotation axis C. The vertical flow path section 321a2 perpendicularly connects the outer flow path section 321a1 to the inner flow path section 321a3. In some embodiments, the discharging passages 321a, 323a, 325a, and 327a have a similar configuration, therefore the structural features of the fluid passages 323a, 325a, and 327a are omitted for brevity. However, it is appreciated that the first discharging passages 321a, 323a, 325a, and 327a may have different configurations.

With the discharging assembly 31a, the process gas is able to pass over most of the area of the semiconductor wafer 5 to deposit a silicon film on the semiconductor wafer 5. However, the process gas from the discharging assembly 31a tends to converge at the center of the semiconductor wafer 5 as it passes through the semiconductor wafer 5. Variation between center and edge portions of the silicon film deposited on the semiconductor wafer 5 may occur.

To provide a solution to the problem, a second gas supplying module 80, as shown in FIG. 2, is therefore provided, in accordance with some embodiments. The second gas supplying module 80 is configured to supply process gas, such as silicon source gas, into the chamber 19. The process gas from the second gas supplying module 80 is supplied along a direction that is different from the direction along which the process gas from the gas-supply module 70 flows. For example, the process gas from the gas-supply module 70 is supplied substantially along the transversal line T, and the process gas supplied by the second gas supplying module 80 passes through the semiconductor wafer 5 along a direction perpendicular to the transversal line T. Through such an arrangement, the process gas is uniformly supplied to the semiconductor wafer 5, and a silicon film with uniform film profile is formed on the semiconductor wafer 5.

However, because each of the discharging passages 321a, 323a, 325a, and 327a have a vertical fluid path section, a turbulent flow of the process gas may result, causing a failure of the process. Specifically, when the process gas passes through the fluid inlet module 30a, the process gas is lifted by the discharging passage 321a, and the process gas is not in contact with the wafer 5 as indicated by the arrows in FIG. 1. As a result, the silicon film cannot be deposited on the wafer 5 uniformly.

Therefore, it is desirable to find an alternative wafer process apparatus 1b, which is capable of reducing or resolving the problems mentioned above.

Figure 3:
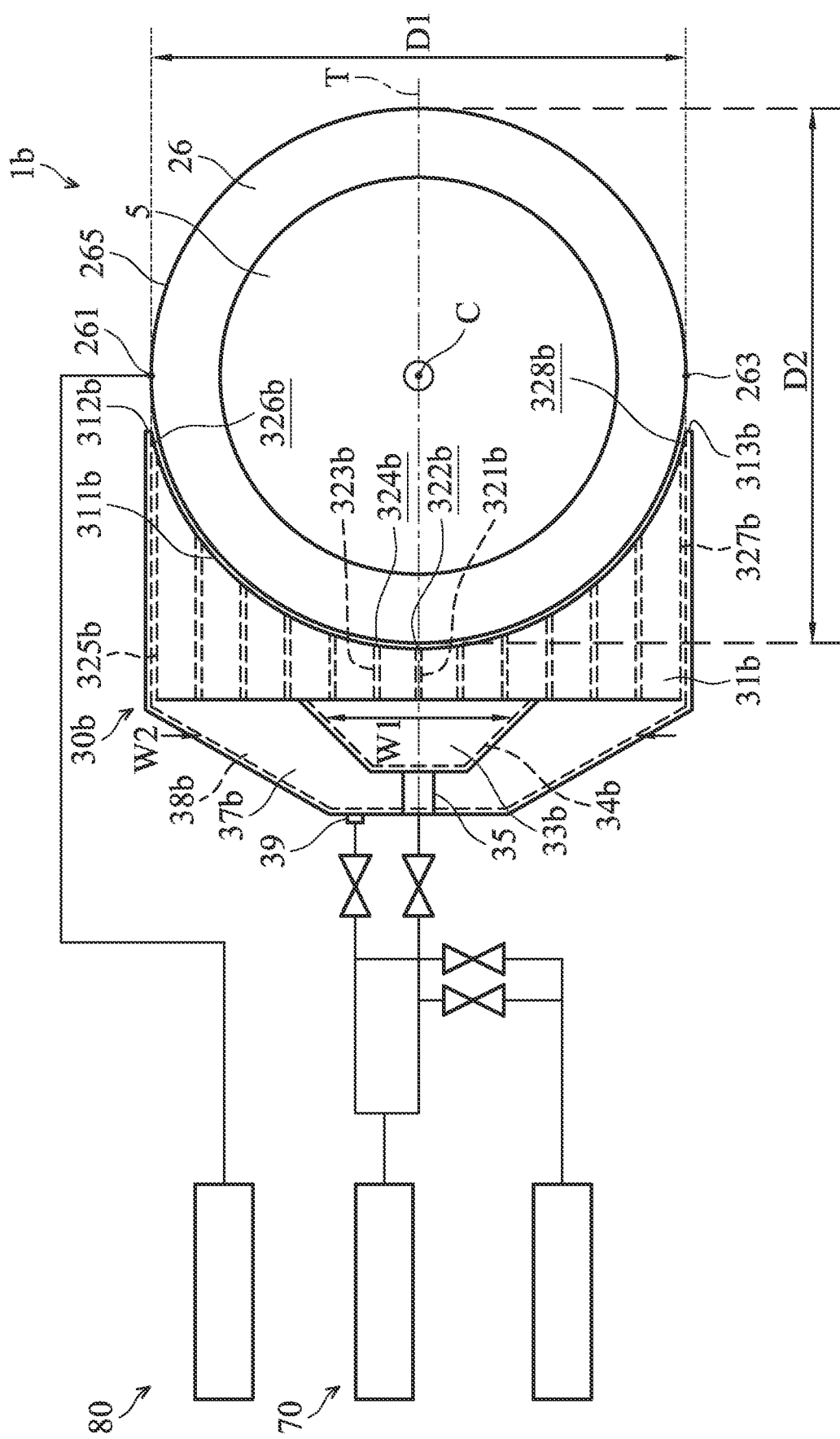
FIG. 3 shows a top view of a wafer process apparatus, in accordance with some embodiments.

Referring to FIG. 3, a top view of the wafer process apparatus 1b is illustrated, in accordance with some embodiments. In some embodiments, differences between the wafer process apparatus 1b and the wafer process apparatus 1a include the fluid inlet module 30a being replaced by a fluid inlet module 30b. The fluid inlet module 30b includes a discharging assembly 31b, one or more interface assemblies, such as interface assemblies 33b and 37b, and the inlet connector assemblies 35 and 39, in accordance with some embodiments.

The interface assembly 33b has an interface passage 34b fluidly connected to the inlet connector assembly 35. The interface assembly 37b has a fluid passage 38b fluidly connected to the inlet connector assembly 39. The width W1 of the interface passage 34b and the width W2 of the fluid passage 38b may be varied. For example, the width W1 of the interface passage 34b and the width W2 of the fluid passage 38*b* are gradually increased in a direction toward the discharging assembly 31*b* and parallel to the transversal line T. With such an arrangement, the process gas from the first gas-supply module 70 can be evenly guided and distributed to the discharging assembly 31*b* via the interface assembly 33*b* and 37*b*.

In some embodiments, the interface passage 34*b* of the interface assembly 33*b* is not fluidly connected to the fluid passage 38*b* of the interface assembly 37*b*. The gas passing through the interface passage 34*b* of the interface assembly 33*b* is isolated from the gas passing through the fluid passage 38*b* of the interface assembly 37*b*. As a result, the gas passing through the interface passage 34*b* of the interface assembly 33*b* and the gas passing through the fluid passage 38*b* of the interface assembly 37*b* are controlled independently. However, the interface passage 34*b* of the interface assembly 33*b* can be fluidly connected to the fluid passage 38*b* of the interface assembly 37*b*.

The discharging assembly 31*b* is connected to the interface assemblies 33*b* and 37*a*. The discharging assembly 31*b* has a lateral surface 311*b* arranged adjacent to the edge 265 of the stage 26. In some embodiments, the lateral surface 311*b* is a curved surface partially surrounding the rotation axis C. The lateral surface 311*b* extends toward opposite sides of the transversal line T and terminates at two ends 312*b* and 313*b*. The two ends 312*b* and 313*b* are respectively adjacent to two edge points 261 and 263 of the stage 26 that are farthest away from the transversal line T. The direct distance D1 between two ends 312*b* and 313*b* of the lateral surface 311*b* is equal to or greater than the width D2 of the stage 26.

The discharging assembly 31*b* may include one or more discharging passages configured for allowing process gas from the interface assemblies 33*b* and 37*b* to be discharged to the semiconductor wafer 5. For example, as shown in FIG. 3, the discharging assembly 31*b* includes multiple discharging passages, such as discharging passages 321*b*, 323*b*, 325*b*, and 327*b*. The discharging passages 321*b*, 323*b*, 325*b*, and 327*b* are fluidly connected the fluid passages 34*b* and 38*b* to the openings formed on the lateral surface 311*b* of the discharging assembly 31*b*.

In some embodiments, one end of each of the discharging passages 321*b* and 323*b* is fluidly connected to the interface passage 34*b* of the interface assembly 33*b*. The other end of each of the discharging passages 321*b* and 323*b* is fluidly connected to one of the openings 322*b* and 324*b* formed on the lateral surface 311*b*. In addition, one end of each of the fluid passages 325*b* and 327*b* is fluidly connected to the fluid passage 38*b* of the interface assembly 37*b*. The other end of each of the fluid passages 325*b* and 327*b* is fluidly connected to one of the openings 326*b* and 328*b* formed on the lateral surface 311*b*. In some embodiments, the openings 326*b* and 328*b* are directly corresponds to the edge points 261 and 263 of the stage 26. The direct distance between the openings 326*b* and 328*b* is substantially equal to the width D2 of the stage 26. Through the openings 322*b*, 324*b*, 326*b*, and 328*b* the process gas provided by the fluid inlet module 30*b* is uniformly distributed over the stage 26.

Figure 4:
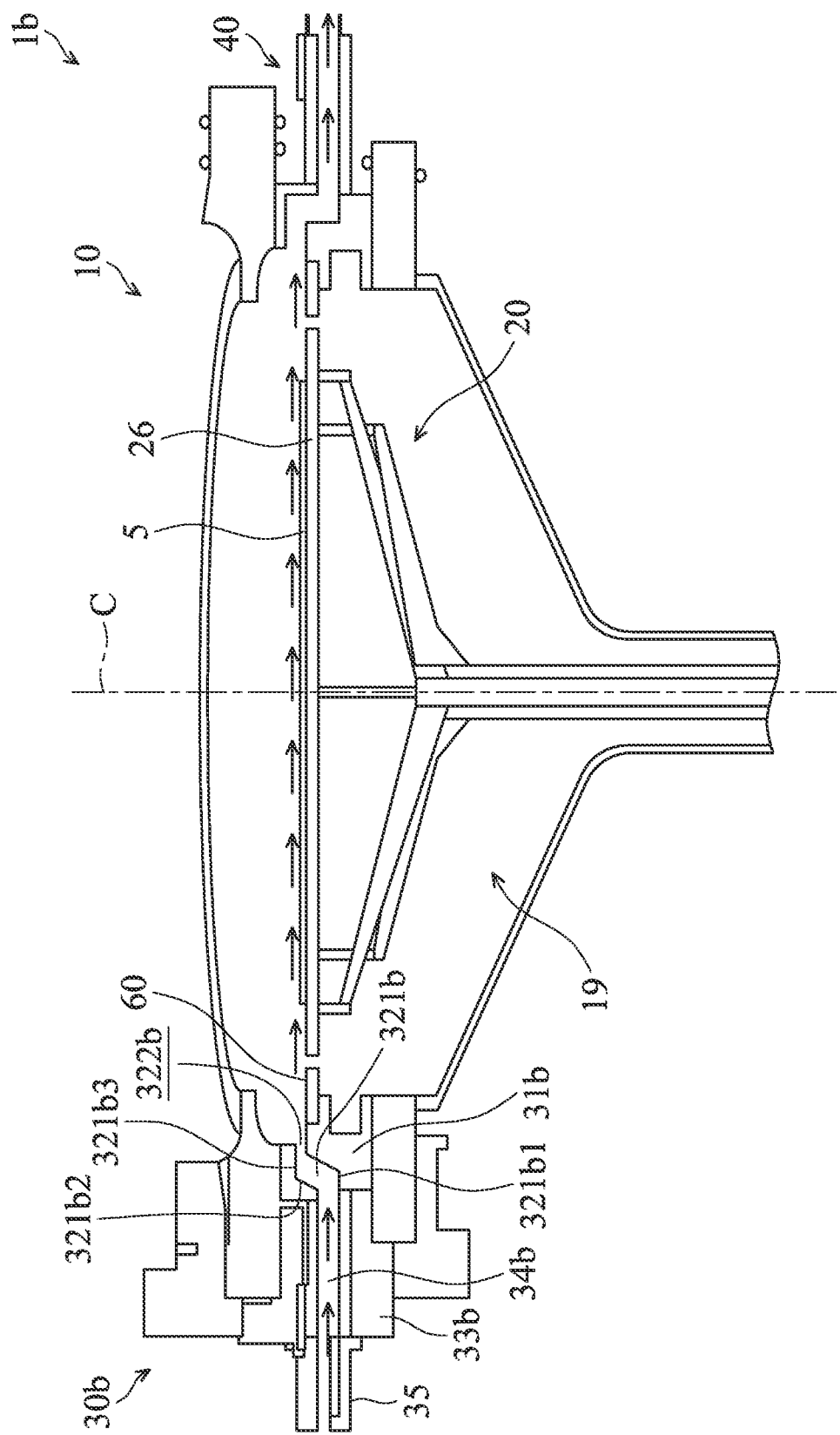
FIG. 4 shows a cross-sectional view of a wafer process apparatus, in accordance with some embodiments.

The structural features of the discharging passages 321*b*, 323*b*, 325*b*, and 327*b* are described herein. Referring to FIG. 4, a cross-sectional view of a wafer process apparatus 1*b* is shown, in accordance with some embodiments. In some embodiments, the discharging passage 321*b* is configured without a vertical flow path section. Namely, no right angle is formed at the discharging passage 321*b*. For example, the discharging passage 321*b* includes an outer flow path section 321*b*1, a sloped flow path section 321*b*2, and an inner flow path section 321*b*3. The outer flow path section 321*b*1 is fluidly connected to the interface passage 34*b*. The sloped flow path section 321*b*2 fluidly connects the outer flow path section 321*b*1 to the inner flow path section 321*b*3. The outer flow path section 321*b*1 and the inner flow path section 321*b*3 extend in a direction perpendicular to the rotation axis C, and the sloped flow path section 321*b*2 extends at an upward angle from the outer flow path section 321*b*1 to the inner flow path section 321*b*3.

In some embodiments, the discharging passages 321*b*, 323*b*, 325*b*, and 327*b* have a similar configuration, therefore the structural features of the fluid passages 323*b*, 325*b*, and 327*b* are omitted for brevity. However, it is appreciated that the first discharging passages 321*b*, 323*b*, 325*b*, and 327*b* may have different configurations, and that the structural features of the fluid inlet module 30*b* can be modified based on user demand.

Referring to FIG. 5, a cross-sectional view of a discharging assembly 30*c* is shown, in accordance with some embodiments. In some embodiments, differences between the fluid inlet module 30*b* and the fluid inlet module 30*c* include the discharging assembly 31*b* being replaced by a discharging assembly 31*c*.

In some embodiments, the discharging assembly 31*c* includes one or more discharging passages, such as discharging passage 321*c*. One end of the discharging passage 321*c* is fluidly connected to the interface passage 34*b* of the interface assembly 33*b*. Another end of the discharging passage 321*c* is fluidly connected to an opening 322*c* formed on the lateral surface 311*c* of the discharging assembly 31*c*. In some embodiments, the discharging passage 321*c* is configured without a vertical flow path section. For example, the discharging passage 321*c* includes a horizontal flow path section extending in a direction that is perpendicular to the rotation axis C (FIG. 4).

Referring to FIG. 6, a cross-sectional view of a discharging assembly 30*d* is shown, in accordance with some embodiments. In some embodiments, differences between the fluid inlet module 30*b* and the fluid inlet module 30*d* include the discharging assembly 31*b* being replaced by a discharging assembly 31*d*.

In some embodiments, the discharging assembly 31*d* includes one or more discharging passages, such as discharging passage 321*d*. One end of the discharging passage 321*d* is fluidly connected to the interface passage 34*b* of the interface assembly 33*b*. The other end of the discharging passage 321*d* is fluidly connected to an opening 322*d* formed on the lateral surface 311*d* of the discharging assembly 31*d*.

In some embodiments, the discharging passage 321*d* is configured without a vertical flow path section. For example, the discharging passage 321*d* includes an outer flow path section 321*d*1, a sloped flow path section 321*d*2, and an inner flow path section 321*d*3. The outer flow path section 321*d*1 is fluidly connected to the interface passage 34*b*. The sloped flow path section 321*d*2 fluidly connects the outer flow path section 321*d*1 to the inner flow path section 321*d*3. The outer flow path section 321*d*1 and the inner flow path section 321*d*3 extend in a direction perpendicular to the rotation axis C (FIG. 4), and the sloped flow path section 321*d*2 extends at a downward angle from the outer flow path section 321*d*1 to the inner flow path section 321*d*3.

In some embodiments, the discharging assembly 31*d* includes a lower member 361 and an upper member 364. The upper member 364 is positioned higher than the lower member 361 relative to the stage 20 (FIG. 1). The lower member 361 has a first surface 362 arranged adjacent to the discharged passage 321d. A groove 363 is formed on the first surface 352 of the lower member 361. The groove 363 is connected to the lateral surface 311d and partially surrounds the rotation axis C (FIG. 1). The upper member 364 has a second surface 365 arranged adjacent to the discharged passage 321d and faces the first surface 362. In addition, the upper member 364 has a protrusion 366 located on the second surface 365 and positioned relative to the groove 363. The protrusion 366 projects toward the groove 363 to define the sloped flow path section 321d2 and the inner flow path section 321d3.

In some embodiments, a lower region 311d1 of the lateral surface 311d of the discharging assembly 31d which corresponds to the lower member 361 is closer to the stage 20 (FIG. 1) than an upper region 311d2 of the discharging assembly 31d which corresponds to the upper member 362. A flange 367 is connected to the lower region 311d1 of the lateral surface 311d. A bottom surface of the groove 363, the lower region 311d1 of the lateral surface 311d and an upper surface of the flange 367 are arranged in order and form a step structure.

The fluid inlet modules 30b, 30c, and 30d have the advantage that the sloped flow path section or horizontal flow path section prevents a turbulent flow from being produced. On the contrary, a laminar flow of the process gas from the fluid inlet modules 30b, 30c, and 30d to the fluid outlet module 40 is produced, as indicated by arrows shown in FIG. 4. The process gas is able to be in contact with the wafer 5, and the silicon film can be deposited on the semiconductor wafer 5 evenly.

The fluid inlet modules 30b, 30c, and 30d also have the advantage that a reduction of manufacturing cost is realized. Since the fluid inlet modules 30b, 30c, and 30d are able to guide the process gas over the semiconductor wafer 5. The second gas supplying module 80 can be omitted, and the usage of the process gas is reduced.

Embodiments of mechanisms for supplying process gas into wafer process apparatus is disclosed. The process gas is smoothly supplied to a semiconductor wafer via a discharging passage configured with a sloped flow path section or a horizontal flow path section. A turbulent flow of the process gas due to a vertical flow path section is avoided. Therefore, a silicon film is formed on the semiconductor wafer uniformly. The manufacturing efficiency and production yield of the wafer are greatly improved.

In accordance with some embodiments, a wafer process apparatus is provided. The wafer process apparatus includes a chamber and a susceptor module. The susceptor module is positioned in the chamber. The susceptor module includes a stage for supporting a wafer and is rotatable about a rotation axis. The wafer process apparatus also includes a discharging assembly and a fluid outlet assembly. The discharging assembly and the fluid outlet assembly are positioned at two sides of the susceptor module. The discharging assembly includes a discharging passage configured without a vertical flow path section.

In accordance with some embodiments, a wafer process apparatus is provided. The wafer process apparatus includes a chamber and a susceptor module. The susceptor module is positioned in the chamber. The susceptor module includes a stage for supporting a wafer and is rotatable about a rotation axis. The wafer process apparatus also includes a discharging assembly and a fluid outlet assembly. The discharging assembly and the fluid outlet assembly are positioned at two sides of the susceptor module. The discharging assembly includes a lateral surface adjacent to the stage and partially surrounding the rotation axis. An opening is arranged on the lateral surface and configured to provide a process gas to the chamber. The distance between two ends of the lateral surface is equal to or greater than the width of the stage.

In accordance with some embodiments, a method for processing a semiconductor wafer is provided. The method includes providing a wafer process apparatus. The wafer process apparatus includes a chamber and a stage positioned in the chamber for supporting the semiconductor wafer. The method also includes supplying a process gas to the semiconductor wafer via a discharging assembly that is adjacent to the stage. The discharging assembly includes a discharging passage configured without a vertical flow path section.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A wafer process apparatus, comprising:
   a chamber;
   a susceptor module positioned in the chamber, wherein the susceptor module comprises a stage for supporting a semiconductor wafer and is rotatable about a rotation axis;
   a discharging assembly and a fluid outlet assembly positioned at two sides of the susceptor module, wherein the discharging assembly has a lateral surface adjacent to the stage and partially surrounding the rotation axis, and a plurality of openings are arranged on the lateral surface and configured for providing a process gas to the chamber, wherein the discharging assembly comprises a plurality of discharging passages connected to the openings, respectively, wherein each of the discharging passages is a step structure comprising an outer flow path section, a linearly sloped flow path section, and an inner flow path section, wherein the outer flow path section and the inner flow path section extend in a direction perpendicular to the rotation axis, and the linearly sloped flow path section extends at a downward angle from the outer flow path section to the inner flow path section;
   an interface passage connected to a first group of the discharging passages of the discharging assembly, wherein an inner wall of the interface passage intersects the discharging assembly at an acute angle when viewed along the direction of the rotation axis, and in a direction toward the discharging assembly, a width of the interface passage is increased to have a trapezoidal shape; and
   a fluid passage connected to a second group of the discharging passages of the discharging assembly, wherein an inner wall of the fluid passage intersects the discharging assembly at an acute angle when viewed along the direction of the rotation axis, wherein the fluid passage is disposed outside the interface passage and surrounding the interface passage, wherein the fluid passage comprises two arm portions connected to the second group of the discharging passages and a central portion between and linking the two arm portions, and a width of each of the two arm portions is gradually increased in the direction toward the discharging assembly, wherein the discharging assembly comprises:

a lower member having a first surface, wherein a groove is formed on the first surface and immediately connected to the lateral surface; and an upper member having a second surface positioned higher than the first surface relative to the stage, wherein the upper member has a protruding portion positioned relative to the groove and projecting toward the groove from the second surface to define one of the discharging passages, wherein a lower region of the lateral surface of the discharging assembly which corresponds to the lower member is closer to the stage than an upper region of the discharging assembly which corresponds to the upper member, and a flange is connected to the lower region of the lateral surface, wherein a bottom surface of the groove, the lower region of the lateral surface and an upper surface of the flange are arranged in order and form a step structure, wherein in the direction of the rotation axis, the outer flow path section is higher than the inner flow path section, and the inner flow path section is higher than the upper surface of the flange at the same height as the stage.

2. The wafer process apparatus as claimed in claim 1, wherein each of the discharging passages extends in a direction that is parallel to a traversal line that passes through the rotation axis;
wherein the lateral surface extends toward opposite sides of the transversal line and terminates at two ends;
wherein a distance between two ends of the lateral surface is equal to or greater than a width of the stage.

3. The wafer process apparatus as claimed in claim 2, wherein two of the openings are respectively arranged adjacent to the two ends of the lateral surface.

4. The wafer process apparatus as claimed in claim 1, wherein each of the discharging passages is configured without a flow path section that extends in a direction parallel to the rotation axis.

5. The wafer process apparatus as claimed in claim 1, wherein a width of one of the first group of the discharging passages is smaller than the width of the interface passage, and a width of one of the second group of the discharging passages is smaller than the width of one of the two arm portions of the fluid passage.

6. The wafer process apparatus as claimed in claim 1, wherein one end of the interface passage is fluidly connected to the first group of the discharging passages, and the other end of the interface passage is fluidly connected to a first gas inlet connector,
Wherein one end of the fluid passage is fluidly connected to the second group of the discharging passages, and the other end of the fluid passage is fluidly connected to a second gas inlet connector.

7. The wafer process apparatus as claimed in claim 6, wherein the second gas inlet connector is connected to the fluid passage at the central portion.

8. The wafer process apparatus as claimed in claim 1, wherein the process gas passing through the interface passage is isolated from the process gas passing through the fluid passage.

9. The wafer process apparatus as claimed in claim 1, further comprising a gas supplying module configured to supply a second process gas into the chamber via a gas line;
wherein an intersection of the inner wall of the fluid passage and the discharging assembly is aligned with an outermost edge point of the stage and aligned with an end of the gas line.

10. A wafer process apparatus, comprising:
a chamber;
a susceptor module positioned in the chamber, wherein the susceptor module comprises a stage for supporting a semiconductor wafer and is rotatable about a rotation axis;
a discharging assembly and a fluid outlet assembly positioned at two sides of the susceptor module, wherein the discharging assembly comprises a lateral surface adjacent to the stage and partially surrounding the rotation axis, and a plurality of openings are arranged on the lateral surface and configured to provide a process gas to the chamber, wherein a distance between two ends of the lateral surface is equal to or greater than a width of the stage which extends across the rotation axis, wherein a first group of the openings are arranged on a central region of the lateral surface, and a second group of the openings are arranged on two lateral regions of the lateral surface, the two lateral regions are respectively located between two sides of the central region and the two ends of the lateral surface,
wherein the discharging assembly comprises a plurality of discharging passages connected to the openings, respectively, and each of the discharging passages is a step structure comprising an outer flow path section, a linearly sloped section, and an inner flow path section, wherein the outer flow path section, and the inner flow path section extend in a direction perpendicular to the rotation axis, and the linearly sloped flow path section extends at a downward angle from the outer flow path section to the inner flow path section;
an interface passage connected to the first group of the openings through a first group of the discharging passages of the discharging assembly, wherein an inner wall of the interface passage intersects the discharging assembly at an acute angle when viewed along the direction of the rotation axis, and in a direction toward the discharging assembly, a width of the interface passage is increased to have a trapezoidal shape; and
a fluid passage connected to the second group of the openings through a second group of the discharging passages of the discharging assembly, wherein an inner wall of the fluid passage intersects the discharging assembly at an acute angle when viewed along the direction of the rotation axis,
wherein the fluid passage is disposed outside the interface passage and surrounding the interface passage, wherein the fluid passage comprises two arm portions connected to the second group of the discharging passages and a central portion between and linking the two arm portions, and a width of each of the two arm portions is gradually increased in the direction toward the discharging assembly,
wherein the discharging assembly comprises:

a lower member having a first surface, wherein a groove is formed on the first surface and immediately connected to the lateral surface; and an upper member having a second surface positioned higher than the first surface relative to the stage, wherein the upper member has a protruding portion positioned relative to the groove and projecting toward the groove from the second surface to define one of the discharging passages, wherein a lower region of the lateral surface of the discharging assembly which corresponds to the lower member is closer to the stage than an upper region of the discharging assembly which corresponds to the upper member, and a flange is connected to the lower region of the lateral surface, wherein a bottom surface of the groove, the lower region of the lateral surface and an upper surface of the flange are arranged in order and form a step structure, wherein in the direction of the rotation axis, the outer flow path section is higher than the inner flow path section, and the inner flow path section is higher than the upper surface of the flange at the same height as the stage.

11. The wafer process apparatus as claimed in claim 10, wherein the plurality of discharging passages connecting both the fluid passage and the interface passage to the openings each is configured without a flow path section that extends in a direction parallel to the rotation axis.

12. The wafer process apparatus as claimed in claim 10, further comprising a gas supplying module configured to supply a second process gas into the chamber via a gas line; wherein an intersection of the inner wall of the fluid passage and the discharging assembly is aligned with an outermost edge point of the stage and aligned with an end of the gas line.

13. The wafer process apparatus as claimed in claim 12, wherein each of the discharging passages extends in a direction that is parallel to a traversal line passing through the rotation axis, and the stage comprises two edge points arranged along a direction that is perpendicular to the traversal line, and the width of the stage is equal to the distance between the two edge points,
wherein one of the edge points directly faces the end of the gas line of the gas supplying module and is aligned with one of the openings that is farthest away from the traversal line in a straight line parallel to the traversal line, and when viewed in a direction of the traversal line, the discharging passage associated with the opening that is farthest away from the traversal line does not overlap with the semiconductor wafer,
wherein the intersection of the inner wall of the fluid passage and the discharging assembly is aligned with the outermost edge point of the stage and aligned with the end of the gas line in the straight line parallel to the traversal line.

14. The wafer process apparatus as claimed in claim 10, wherein the interface passage and the fluid passage are fluidly connected to the chamber through the discharging assembly.

15. A method for processing a semiconductor wafer, comprising:
providing a wafer process apparatus comprising a chamber and a stage positioned in the chamber for supporting the semiconductor wafer;
supplying a process gas to the semiconductor wafer via a discharging assembly, an interface passage, and a fluid passage of the wafer process apparatus, wherein the discharging assembly has a lateral surface adjacent to the stage and partially surrounding a rotation axis of the stage, and a plurality of openings are arranged on the lateral surface and configured for providing the process gas to the chamber,
wherein the discharging assembly comprises a plurality of discharging passages connected to the openings, respectively, wherein each of the discharging passage is a step structure comprising an outer flow path section, a linearly sloped flow path section, and an inner flow path section, wherein the outer flow path section and the inner flow path section extend in a direction perpendicular to the rotation axis, and the linearly sloped flow path section extends at a downward angle from the outer flow path section to the inner flow path section,
wherein the interface passage is connected to a first group of the discharging passages of the discharging assembly so as to supply the process gas to the first group of the discharging passages, wherein an inner wall of the interface passage intersects the discharging assembly at an acute angle when viewed along the direction of the rotation axis, and in a direction toward the discharging assembly, a width of the interface passage is increased to have a trapezoidal shape,
wherein the fluid passage is connected to a second group of the discharging passages of the discharging assembly so as to supply the process gas to the second group of the discharging passages, wherein an inner wall of the fluid passage intersects the discharging assembly at an acute angle when viewed along the direction of the rotation axis,
wherein the fluid passage is disposed outside the interface passage and surrounding the interface passage, wherein the fluid passage comprises two arm portions connected to the second group of the discharging passages and a central portion between and linking the two arm portions, and a width of each of the two arm portions is gradually increased in the direction toward the discharging assembly,
wherein the discharging assembly comprises:
a lower member having a first surface, wherein a groove is formed on the first surface and immediately connected to the lateral surface; and
an upper member having a second surface positioned higher than the first surface relative to the stage, wherein the upper member has a protruding portion positioned relative to the groove and projecting toward the groove from the second surface to define one of the discharging passages,
wherein a lower region of the lateral surface of the discharging assembly which corresponds to the lower member is closer to the stage than an upper region of the discharging assembly which corresponds to the upper member, and a flange is connected to the lower region of the lateral surface, wherein a bottom surface of the groove, the lower region of the lateral surface and an upper surface of the flange are arranged in order and form a step structure, wherein in the direction of the rotation axis, the outer flow path section is higher than the inner flow path section, and the inner flow path section is higher than the upper surface of the flange at the same height as the stage.

16. The method as claimed in claim 15, wherein each of the discharging passages extends in a direction that is parallel to a traversal line that passes through the rotation axis;
wherein the lateral surface extends toward opposite sides of the transversal line and terminates at two ends;

wherein a distance between the two ends of the lateral surface is equal to or greater than a width of the stage.

17. The method as claimed in claim 16, wherein the process gas from the discharging assembly is supplied substantially along the transversal line.

18. The method as claimed in claim 15, wherein the method further comprising rotating the stage about the rotation axis.

19. The method as claimed in claim 15, wherein the process gas from the discharging passages is directed downwardly to a plane at which the semiconductor wafer is located.

20. The method as claimed in claim 15, further comprising:
   supplying a second process gas from a gas supplying module into the chamber via a gas line, wherein one of the edge points directly faces an end of the gas line and is aligned with one of the openings that is farthest away from the traversal line in a straight line parallel to the traversal line, and when viewed in a direction of the traversal line, the discharging passage associated with the opening that is farthest away from the traversal line does not overlap with the semiconductor wafer.

* * * * *